US007808275B1

(12) United States Patent
Ansel et al.

(10) Patent No.: US 7,808,275 B1
(45) Date of Patent: Oct. 5, 2010

(54) INPUT BUFFER WITH ADAPTIVE TRIP POINT

(75) Inventors: George McCollough Ansel, Starksville, MS (US); Jeffery Scott Hunt, Ackerman, MS (US); Anand Kumar Chamakura, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 11/757,905

(22) Filed: Jun. 4, 2007

Related U.S. Application Data

(60) Provisional application No. 60/811,461, filed on Jun. 5, 2006.

(51) Int. Cl.
  *H03K 19/0175* (2006.01)
  *H03K 19/094* (2006.01)
  *H03L 5/00* (2006.01)

(52) U.S. Cl. .................... 326/82; 326/68; 327/333

(58) Field of Classification Search .......... 326/62, 326/68, 80, 83, 86, 87, 112, 115, 119, 121; 327/108, 109, 333
See application file for complete search history.

(56) References Cited

U.S. PATENT DOCUMENTS

| 6,064,229 | A | * | 5/2000 | Morris | 326/81 |
| 6,781,419 | B2 | * | 8/2004 | Harrison | 326/95 |
| 7,102,389 | B2 | * | 9/2006 | Chen et al. | 326/81 |
| 2005/0046449 | A1 | * | 3/2005 | Davis | 327/112 |
| 2006/0049847 | A1 | * | 3/2006 | Chen | 326/87 |
| 2006/0214718 | A1 | * | 9/2006 | Chen | 327/333 |

* cited by examiner

*Primary Examiner*—Vibol Tan
*Assistant Examiner*—Dylan White

(57) ABSTRACT

Disclosed is a circuit comprising an inverter circuit which comprises inverters and level shifters; and a modulation circuit comprising a pull-up circuit and a pull-down circuit, the modulation circuit coupled to the inverter circuit to regulate the response of the circuit to an input voltage for various power supply voltage levels by the pull-up or pull-down circuit. Other embodiments are also disclosed.

11 Claims, 6 Drawing Sheets

INPUT BUFFER WITH ADAPTIVE TRIP POINT

CROSS-REFERENCE TO RELATED APPLICATIONS

The present application claims the benefit of priority under 35 U.S.C. 119(e) to U.S. Provisional Patent Application Ser. No. 60/811,461 entitled Input Buffer with Adaptive Trip Point; which application is hereby incorporated by reference.

TECHNICAL FIELD

The invention relates to an electronic circuitry in general. In particular the invention relates to a circuit with an input buffer with adaptive trip points that translates the input signals to a chip into internal logic signals, wherein the trip points are dynamically controlled across a wide range of supply voltages.

BACKGROUND

The usage of low voltage power supplies where appropriate can effectively reduce overall power consumption in an electronic circuit. Parts of the circuit that require a higher voltage can use a higher voltage supply, and parts of the circuit that can operate using a lower voltage supply can use the lower voltage supply thus using less power.

FIG. 1 illustrates a circuit 100 comprising a conventional inverter combined with a level shifter. The circuit 100 comprises a PMOS 101 (P1) and a first NMOS 102 (N1) and a second NMOS 103 (N2) coupled between an input signal 104 (IN) and an output signal 105 (OUT) of the circuit 100. An input unregulated power supply voltage 106 (vccio) is coupled to the PMOS 101 to drive the circuit 100. A regulated power supply voltage 107 (vpwr) is supplied to the NMOS 102 (N1). The source of NMOS 103 is maintained at a ground potential. In the circuit described above the input trip point is set by the ratio of P1 and N1 with respect to N2, i.e. (P1 and N1):N2. A disadvantage of the circuitry 100 is that the input trip point is a fixed percentage of the supply voltage level (vccio) across the power supply voltage range. The input trip point can be varied across the supply voltage range by adding switched transistors, for example pull-up transistor and/or pull-down transistors, in parallel with the PMOS 101 and NMOS 102, wherein control signals input to the circuit are required to configure the switched transistors. The input trip point of conventional circuit 100 cannot dynamically adapt to the power supply voltage range.

FIG. 2 illustrates another input buffer circuit 200. The input buffer circuit 200 comprises a plurality of input stages, for example three independent input stages, a first input stage 201, a second input stage 202 and a third input stage 203. For example, each of these pluralities of input stages 201, 202 and 203 comprises NOR gates depicted as nor1, nor2 and nor3. The input trip points of each of the input stages 201, 202 and 203 are typically optimized for a specific power supply voltage range for the circuit 200. The plurality of input stages 201, 202 and 203 are coupled to a fourth NOR gate 208. A NMOS 206 (N1) is coupled to the third input stage 203 and to a regulated power supply voltage Vpwr 207. The plurality of input stages 201, 202, and 203 and other components 208 and 206 are coupled to form a circuit which is supplied with an input signal 204 (in) and produces an output signal 205 (out).

Control signals en1_n, en2_n and en3_n are provided to respective input stages 201, 202 and 203, and the control signals en1_n, en2_n and en3_n are used to select which of the input stages 201, 202 or 203 is in an active state. Only one of the control signals from en1_n, en2_n and en3_n can be in an active state at a given instant of time, for example an instant where the circuit is at logic 0. During this instant of time, one of more of the input stages from 201, 202 and 203, for example 203 (NOR3) may be powered from a low voltage supply (LV) and may be constructed at least partially with LV transistors. The output signal 205 (out) level translation from the vccio supply (HV), a high voltage supply, to the vpwr (LV) supply is incorporated in a combination of the gates.

A disadvantage of the circuit 200 is that multiple input stages are used; one stage for each range of available input trip points, which causes the circuit 200 to have a higher input load capacitance, a higher standby current and requires a larger chip area. A further disadvantage of the circuit 200 is that the selection of the input buffer stages for the desired input trip point requires an external control input signal as the input trip points cannot dynamically adapt to the power supply voltage range.

It would therefore be desirable to have an improved circuit, preferably a circuit that dynamically adapts to power supply voltage ranges, and has a high reliability.

BRIEF DESCRIPTION OF THE DRAWINGS

Aspects of the present inventions are described with reference to the accompanying drawings. The drawings illustrate the embodiments of the invention and together with the description, serve to explain the principles of the invention. In the drawings.

DETAILED DESCRIPTION

Figure 3:
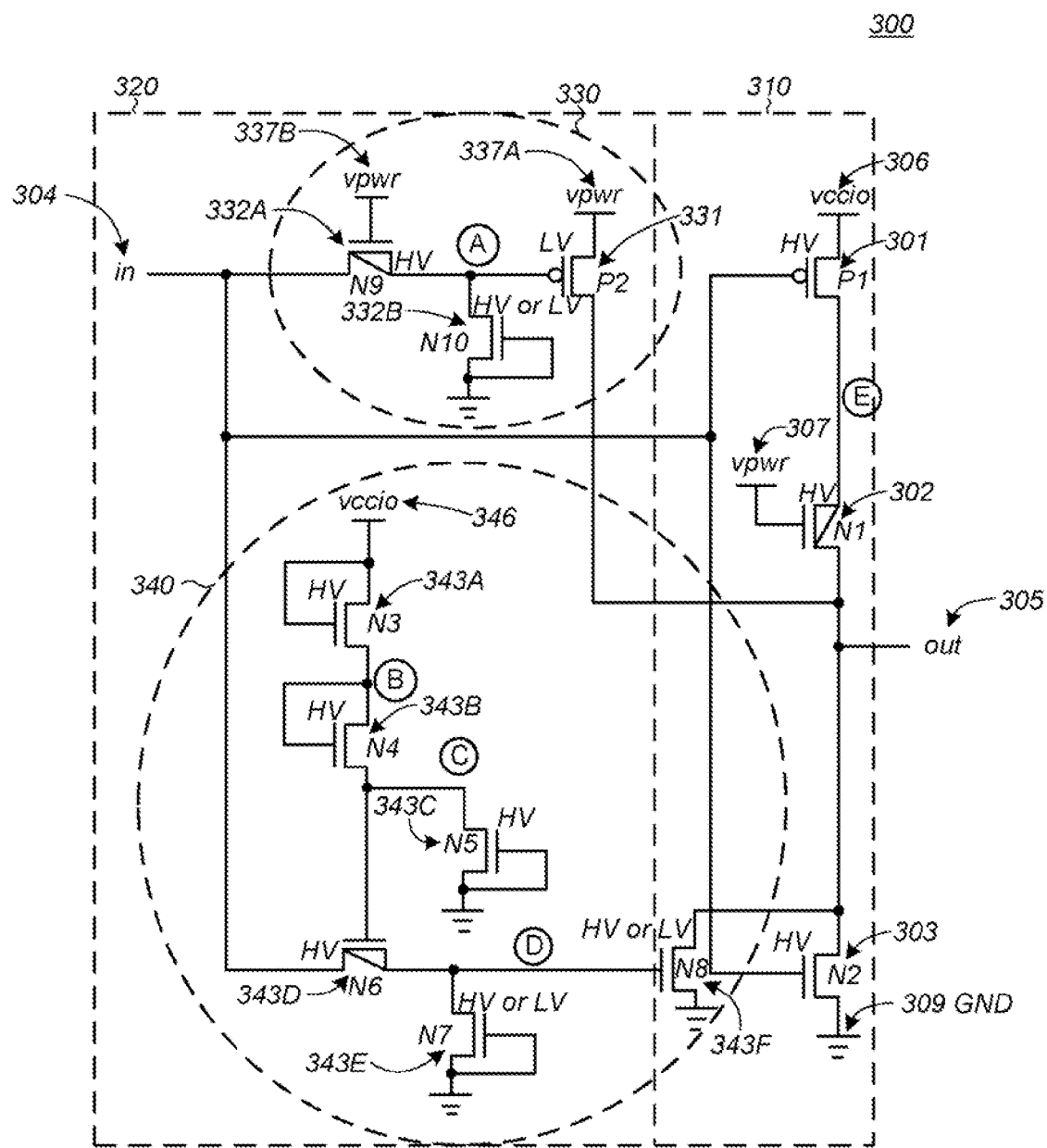
FIG. 3 illustrates an input buffer with adaptive trip points.

According to a first embodiment thereof, as illustrated in FIG. 3 is a circuit 300, which comprises an inverter circuit 310, which further comprises an inverter and a level shifter. A modulation circuit 320 comprising a plurality of transistors coupled to the inverter circuit 310, wherein the modulation circuit 320 regulates the response of the inverter circuit 310 for variable input power supply voltage 306 (vccio). Typically, a CMOS gate, which forms a building block of a digital IC, comprises an n-channel (NMOS) and a p-channel (PMOS) metal-oxide-semiconductor field effect transistors (MOSFET's). The inverter circuit 310 comprises a first PMOS transistor 301, a first NMOS transistor 302 and a second NMOS transistor 303. The first PMOS transistor 301 and the second NMOS transistor 303 comprise a typical CMOS inverter. The first NMOS transistor 302 is a level shifter or a switch which is coupled between the first PMOS transistor 301 and the second NMOS transistor 303. For example, the most important CMOS gate is the CMOS inverter, which comprises only two transistors, a pair of one N-type transistor 303 and one P-type transistor 301.

The circuit 300 comprises PMOS transistor 301 (P1) and first NMOS transistor 302 (N1). A second NMOS transistor 303 (N2) is coupled between an input signal 304 (in) and an output signal 305 (OUT) of the circuit 300. The modulation circuit 320 receives the input signal 304 (in), which is provided to the inverter circuit 310. An input unregulated external power supply voltage 306 (vccio) is coupled to the first PMOS transistor 301 to drive the inverter circuit 310. A regulated power supply voltage 307 (vpwr) is supplied to the first NMOS 302 (N1) and the regulated power supply voltage maintains a constant control voltage in the inverter circuit 310 such that the maximum output 305 of the inverter circuit 310 is approximately equal to the maximum value of the regulated power supply voltage (Vpwr) 307. The source of the second NMOS 303 (N2) is maintained at a ground potential 309 (GND). In the circuit 300 the input trip points are set by the ratio of the first PMOS transistor 301 (P1) and the first NMOS transistor 302 (N1) with respect to the second NMOS 303 (N2), i.e. (P1 and N1):N2, wherein N2 (303) is maintained at a ground potential 309 and P1 transistor 301 is supplied with vccio 306. During the operation of the inverter circuit, it is noticeable that the first NMOS transistor 302 limits the maximum output 305 (out) to the value of the regulated power supply voltage (vpwr) 307.

The modulation circuit 320, which is added to the inverter circuit 310 is advantageous in adapting the input trip point of the inverter circuit 310 by regulating the response of the inverter circuit 310 to the input signal 304 (in), wherein the input power supply voltage 306 (vccio) has a variable range.

In a further embodiment, the modulation circuit 320 of the circuit 300 is coupled to the inverter circuit 310 to regulate the response of the inverter circuit 310 to the input signal 304. The modulation circuit 320 comprises a pull-up circuit 330 and a pull-down circuit 340, wherein the pull-up circuit 330 and the pull-down circuit 340 are coupled between the first NMOS 302 (N1) supplied with a regulated power supply voltage 307 (vpwr) to maintain a constant control voltage in the inverter circuit 310 and the second NMOS 303 (N2) which is maintained at a ground potential 309 (GND).

In a further embodiment, the pull-up circuit 330 comprises a second PMOS transistor 331 (P2), a third NMOS transistor 332A (N9) and a fourth NMOS transistor 332B (N10). In a first step, the second PMOS transistor 331 is supplied with a regulated power supply voltage 337A to maintain a constant supply voltage in the pull-up circuit 330 and is coupled to the inverter circuit 310 between the first NMOS transistor 302 and the second NMOS transistor 303. Preferably, the second PMOS transistor 331 is a low voltage PMOS device. The third NMOS transistor 332A (N9) is coupled between the input signal 304 (in) and the second PMOS transistor 331 (P2) of the pull-up circuit 330. The input signal 304 (in) is provided to the third NMOS transistor 332A (N9) of the pull-up circuit 330 of the modulation circuit 320. The third NMOS transistor 332A is preferably a high voltage NMOS device and performs the role of a switch in the pull-up circuit 330. A fourth NMOS transistor 332B (N10) is coupled between the third NMOS transistor 332A and the second PMOS transistor 331 in the pull-up circuit 330 at a node 'A', the gate terminal and the source terminal of the fourth NMOS transistor 332B are maintained at a ground potential and the fourth NMOS transistor 332B (N10) can either be a high voltage or a low voltage NMOS device.

In a further embodiment, in a first step 360, the pull-up circuit 330 is activated to set the trip points of the inverter circuit 310 when the external power supply voltage, vccio to the inverter circuit is below a predefined threshold value. The pull-up circuit comprising the second PMOS transistor 331, the third NMOS transistor 332A and the fourth NMOS transistor 332B are arranged to set the trip point of the inverter circuit 310 when the external power supply voltage, vccio, 306 is LOW, that is, below a predefined threshold value, when the threshold is equivalent to or below the voltage threshold of the PMOS transistor 301 in the inverter circuit 310. In a second step 362, when the signal vccio 306 is LOW, the pull-up circuit 330 provides the inverter circuit with the necessary pull-up to set the trip point of the inverter circuit 310. The second PMOS transistor 331 defines the pull-up path. In a third step 364, the PMOS transistor 301 is powered off when the vccio, 306 is LOW, i.e., below a predefined threshold voltage and the PMOS transistor 301 is a high voltage PMOS device. The PMOS transistor 331 is powered by the regulated power supply voltage, vpwr 337A and hence the PMOS transistor 331 operates at LOW external power supply voltage, vccio, because the PMOS transistor 331 is a low voltage PMOS device and has a low threshold voltage and the PMOS transistor 331 sets the trip point of the inverter circuit 310. It should be apparent to a person skilled in the art that other known forms of pull-up circuits may be used to perform the same functionality of the pull-up circuit 330 disclosed in this invention.

In a further embodiment, the modulation circuit 320 comprises a pull-down circuit 340. The pull-down circuit 340 comprises a fifth NMOS transistor 343A (N3), a sixth NMOS transistor 343B (N4), a seventh NMOS transistor 343C (N5), an eighth NMOS transistor 343D (N6), a ninth NMOS transistor 343E (N7) and a tenth NMOS transistor 343F (N8). In yet a further embodiment, the fifth NMOS transistor 343A is coupled between a sixth NMOS transistor 343B and an external power supply voltage vccio 346, wherein vccio 346 is supplied to the first NMOS transistor 343A of the pull-down circuit 340, and the gate and drain of the fifth NMOS transistor 343A is coupled to the vccio 346. The gate of the sixth NMOS transistor 343B is coupled between the source of the fifth NMOS transistor 343A and the drain of the sixth NMOS transistor 343B forming the node 'B' in the pull-down circuit 340. The source of the sixth NMOS transistor 343B is coupled to a drain of the seventh NMOS transistor 343C (N5), and the gate is coupled to a node between the source and the ground potential. Preferably, the fifth NMOS transistor 343A, the sixth NMOS transistor 343B and the seventh NMOS transistor 343C are high voltage NMOS devices. The input signal 304 (in) is provided to the eighth NMOS transistor 343D (N6), which is coupled to the sixth NMOS transistor 343B and to the tenth NMOS transistor 343F (N8). A ninth NMOS transistor is coupled at a node 'D' and its gate and source are maintained at a ground potential. The eighth NMOS transistor 343D which is arranged to receive the input signal 304 (IN) is a level shifter or a switch in the pull-down circuit 340 of the modulation circuit 320. The tenth NMOS transistor 343F (N8) is either a high voltage or a low voltage NMOS device and is coupled between the first NMOS transistor 302 and second NMOS transistor 303 of the inverter circuit. The source of the tenth NMOS transistor 343F is also maintained at a ground potential. The NMOS devices 343A, 343B, 343C, 343D, 343E and 343F which are coupled to each other, to the output 305, to the external power supply voltage Vccio 346 and to the ground form the pull-down circuit 340 of the modulation circuit 320. It should be apparent to a person skilled in the art that other known forms of pull-down circuits may be used to perform the same functionality of the pull-down circuit 340 disclosed in this invention.

In a further embodiment, the pull-down circuit 340 is activated to alter the trip points of the inverter circuit 310 when the external power supply voltage to the inverter circuit is above a predefined threshold value, i.e., when the external power supply voltage, vccio, is HIGH. The NMOS devices 343A, 343B, 343C, 343D, 343E and 343F which form the pull-down circuit 340 is a parallel pull-down to the NMOS device 303 of the inverter circuit 310. At low external power supply voltage, the power supply voltage, vccio, is insufficient to pull the node 'C' up since the node 'C' is at a ground potential. The NMOS transistor 343D is turned OFF. The node 'D' is at a low voltage and the NMOS transistor 343F is OFF. At high external power supply voltage, HIGH vccio, the NMOS transistor 343D is ON and the input signal 304 (in) passes to the node 'D' and the pull-down circuit 340 alters the trip point for the inverter circuit 310. Advantageously, the NMOS transistor 343F of the pull-down circuit 340 is a parallel pull-down to the NMOS transistor 303 of the inverter circuit 310 and is responsible for lowering the high trip point value to a lower value depending on the input signal 304 and the power supply voltage level 346 (vccio).

Thus the modulation circuit 320 comprising the pull-up circuit 330 and the pull-down circuit 340 is arranged to modulate the response of the inverter circuit 310 by dynamically regulating the trip points depending on the input signal 304 and the external power supply voltage, vccio.

The operation of the circuit is as follows, wherein the NMOS transistor 302 limits the maximum output voltage 305 (OUT) of the circuit 300 to the regulated power supply voltage, vpwr 307, of the inverter circuit 310. The threshold voltage of the PMOS transistor is defined as Vtp and the threshold voltage of the NMOS is defined as Vtn. Vtp and Vtn can be varied relative to the voltage limits of the logic 0, Vil (low level input voltage), and logic 1, Vih (high level input voltage), at the input.

In a further embodiment, during pull-down modulation, the external voltage supply vccio is less than twice the threshold voltage of the NMOS Vtn., i.e., vccio<2*Vtn (HV). When this condition is satisfied, the NMOS transistor 343A and the NMOS transistor 343B are in an OFF state, such that the node 'C' is at a LOW because of the leakage through the NMOS transistor 343C. The NMOS transistor 343D is in an OFF state, such that the node 'D' is also at a LOW because of the leakage through the NMOS transistor 343E and the NMOS transistor 343F is in an OFF state. In yet a further embodiment, however, in the opposite case when vccio is greater than twice the threshold voltage of the NMOS transistor, i.e., vccio>2*Vtn (HV), the NMOS transistor 343A and the NMOS transistor 343B are in an ON state. The voltage across the node 'C' is approximately vccio−2*Vtn. The NMOS transistor 343D is also in an ON state and the voltage across the node 'D' tracks the voltage on the input 304 (IN) till the voltage reaches a value of IN=vccio−2*Vtn (HV)−Vtn (N6). In some embodiments the NMOS transistor 343D is a native transistor with Vtn~0V. The NMOS transistor 343F contributes to the input trip point if the HIGH voltage on the node 'D' is greater than the threshold voltage Vtn (HV). The n-channel series of diodes from vccio 346 to the node 'C' modulates the action of the NMOS transistor 343F which alters the trip point for the circuit 310.

In a further embodiment, during pull-up modulation the external power supply voltage vccio 306 is less than the magnitude of the threshold voltage, |Vtp|, of the PMOS transistor 301, i.e., vccio<|Vtp (HV)|. The PMOS transistor 301 is in an OFF state. The node 'A' tracks the input 304 (in) and the buffer pull-up strength is set by the PMOS transistor 331. The PMOS transistor 301 does not contribute to the input trip point. In yet a further embodiment, however, when the external power supply voltage, vccio, 306 is substantially greater than the threshold voltage of the PMOS transistor 301, the PMOS transistor 301 is in the ON state for LOW input levels and substantially contributes to setting the input trip point for the circuit 300.

Figure 1:
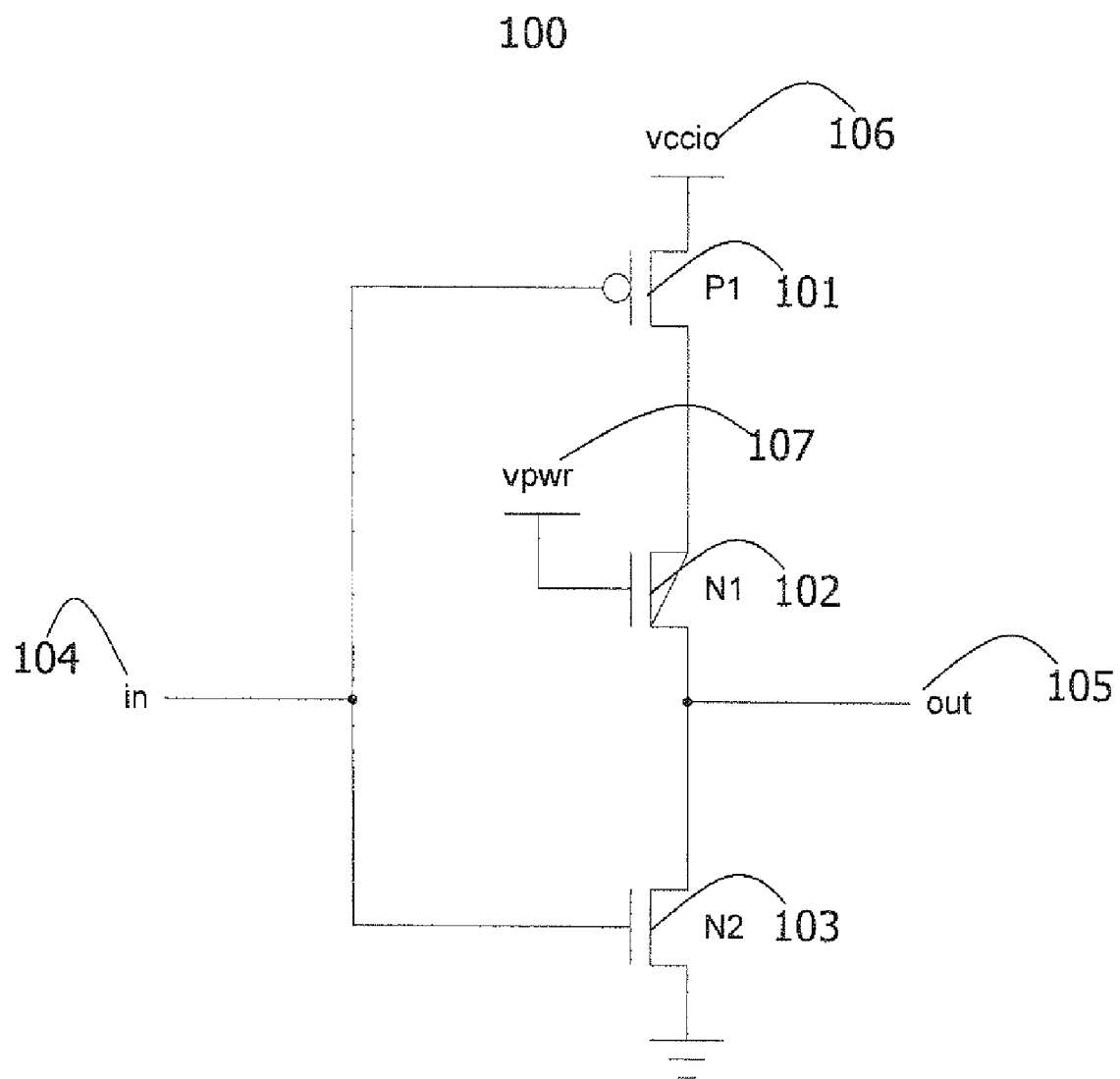
FIG. 1 illustrates a circuit of an inverter combined with a level shifter.
Figure 2:
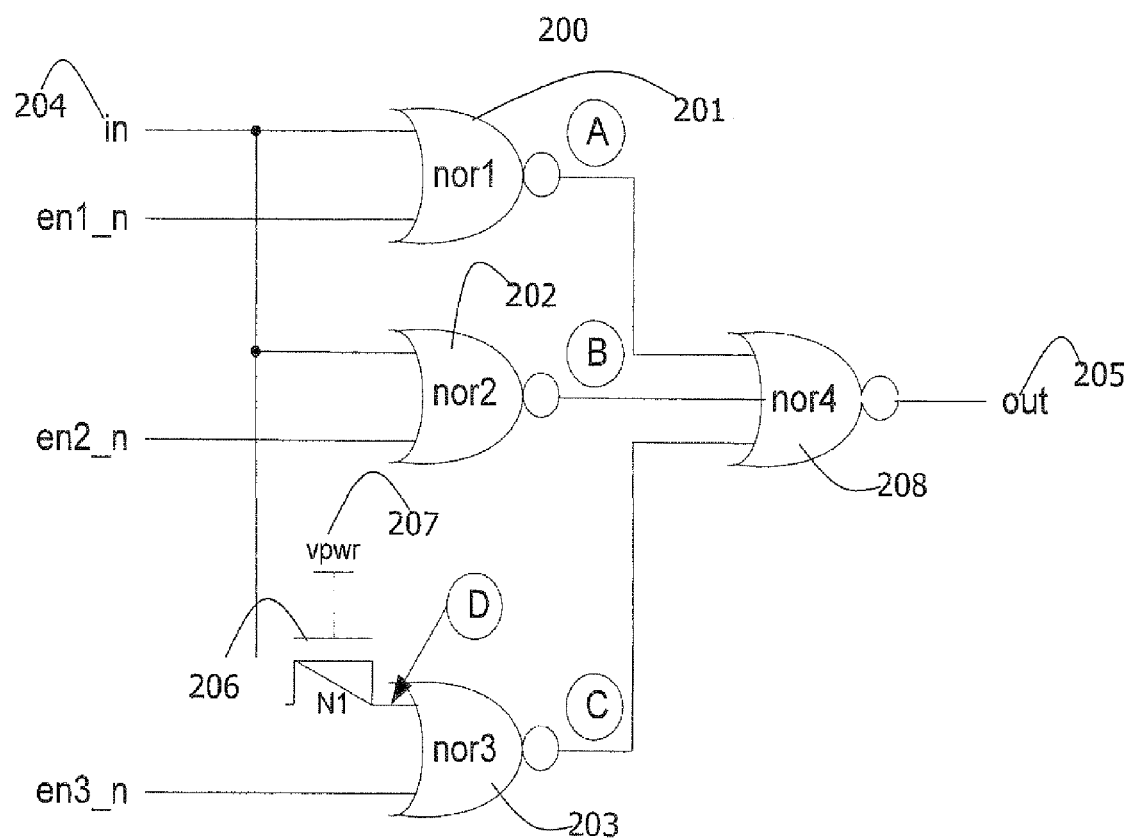
FIG. 2 illustrates a circuit of input buffers comprising multiple input stages with independent control signals.

Such adaptive circuits 300 can be used in a variety of devices such as integrated circuits, CMOS gates etc. as will be apparent to a person skilled in the art. The adaptive circuit 300, which dynamically sets the trip points for an inverter circuit 310 can also be coupled with a combination of NOR gates as described in FIG. 2, thereby achieving a circuit 300 that dynamically adapts to set the trip point for variable power supply voltage ranges.

Reference is again made to FIG. 3, wherein in a further embodiment, a circuit comprises a modulation means 320 wherein the modulation means 320 is arranged to regulate the response of an inverting means 310 for a variable input means 304. Preferably, the modulating means 320 is arranged to dynamically regulate the response of the inverting means 310 such that it dynamically allows the circuit 300 to adapt the trip point for the inverting means 310 of the circuit 300.

In yet a further embodiment, the modulation means 320 comprises a pull-up means 330 and a pull-down means 340, wherein the pull-up means 330 and the pull-down means 340 is arranged for setting a suitable trip-point for the inverting means 310 depending on the external power supply voltage, vccio, as has been described previously.

In a further embodiment, the inverting means 310 comprises a first transistor PMOS 301, a first NMOS transistor 302 and a third NMOS transistor 303 as illustrated in the circuit 300 of FIG. 3. The coupling of these components has been described earlier. In yet a further embodiment, the pull-up means 330 comprises a second PMOS transistor 331, a third NMOS transistor 332A and a fourth NMOS transistor 332B, wherein specific coupling of the components of the pull-up means 330 have been described previously. The pull-down means 340 comprises a plurality of NMOS transistors 343A, 343B, 343C, 343D, 343E and 343F wherein specific coupling of the components of the pull-down means 340 have been described previously.

The modulation means 320 during operation of the pull-down means 340 has an external voltage supply vccio that is less than twice the threshold voltage of the NMOS Vtn., i.e., vccio<2*Vtn (HV). When this condition is satisfied, the NMOS transistor 343A and the NMOS transistor 343B of the pull-down means 340 are in an OFF state, such that the node 'C' in the pull-down means 340 is at a LOW because of the leakage through the NMOS transistor 343C in the pull-down means 340. The NMOS transistor 343D of the pull-down means 340 is in an OFF state, such that the node 'D' is also at a LOW because of the leakage through the NMOS transistor 343E and the NMOS transistor 343F is in an OFF state in the pull-down means 340 of the modulation means 320. However, in the opposite case, wherein vccio is greater than twice the threshold voltage of the NMOS, i.e., vccio>2*Vtn (HV), the NMOS transistor 343A and the NMOS transistor 343B are driven to an ON state in the pull-down means 340. The voltage across the node 'C' is approximately vccio−2*Vtn (HV)−Vtn (N6). In some embodiments N6 (343D) is a native transistor with Vtn~0V. The NMOS transistor 343D of the pull-down circuit 340 is also in an ON state and the voltage across the node 'D' tracks the voltage on the input 304 (in) till the voltage reaches a value of in=(vccio−2*Vtn). The NMOS transistor 343F of the pull-down means 340 contributes to the input trip point if the HIGH voltage across the node 'D' is greater than the threshold voltage Vtn (HV) if N8 (343F) is an HV transistor or Vtn(LV) if N8 (343F) is an LV transistor. The n-channel series of diodes from vccio 346 to the node 'C' modulate the action of the NMOS transistor 343F which alters the trip point for the circuit 300.

In a further embodiment, during operation of the pull-up means 330, the external power supply voltage vccio 306 is less than the magnitude of the threshold voltage, |Vtp|, of the PMOS transistor 301, i.e., Vccio<|Vtp (HV)|. The PMOS transistor 301 is in an OFF state. The node 'A' tracks the input 304 (in) and the buffer pull-up strength is set by the PMOS transistor 331 in the pull-up means 330. The PMOS transistor Table 1 illustrates the input buffer operation at Vin=Vil & Vih where Vil and Vih have been previously defined. Vil is the low input voltage when the logic state is 0 and Vih is the high input voltage at logic state 1 of the circuit 300. If the gate voltage is either at vccio potential or at 0V there is no conducting path from vccio 306 to GND 309, or there is no static current through the inverter circuit 310. Typical switching times for the gate are around 1 nano second, and the static current dissipation occurs only during a fraction of this time, when the input voltage is near vccio/2.

TABLE 1

Input Buffer Operation at Vin = Vil & Vih

| | Conditions | | | | Transistor VGS & States | | | | | | |
|---|---|---|---|---|---|---|---|---|---|---|---|
| | vccio | vpwr | Condition # | Vin | VGS(P2) | P2 | VGS(P1) | P1 | VGS(N8) | N8 | VGS(N2) | N2 |
| Vin = Vil | 1.6 | 1.6 | 1.0 | 0.48 | 1.12 | ON | 1.12 | OFF | 0.0 | OFF | 0.48 | OFF |
| | 1.8 | 1.8 | 2.0 | 0.54 | 1.26 | ON | 1.26 | ON (Weak) | 0.2 | OFF | 0.54 | OFF |
| | 2.7 | 1.8 | 3.0 | 0.80 | 1.00 | ON | 1.19 | ON | 0.8 | ON (Weak) | 0.80 | OFF |
| | 3.3 | 1.8 | 4.0 | 0.80 | 1.00 | ON | 2.50 | ON (strong) | 0.8 | ON (Weak) | 0.80 | OFF |
| | 5.5 | 1.8 | 5.0 | 0.80 | 1.00 | ON | 4.70 | ON (strong) | 0.8 | ON (Weak) | 0.80 | OFF |
| Vin = Vih | 1.6 | 1.6 | 1.1 | 1.10 | 0.50 | OFF | 0.50 | OFF | 0.0 | OFF | 1.10 | ON |
| | 1.8 | 1.8 | 2.1 | 1.30 | 0.50 | OFF | 0.50 | OFF | 0.2 | OFF | 1.30 | ON |
| | 2.7 | 1.8 | 3.1 | 2.00 | 0.00 | OFF | 0.70 | OFF | 1.1 | ON | 2.00 | ON |
| | 3.3 | 1.8 | 4.1 | 2.00 | 0.00 | OFF | 1.30 | ON (weak) | 1.7 | ON (strong) | 2.00 | ON (strong) |
| | 5.5 | 1.8 | 5.1 | 2.00 | 0.00 | OFF | 3.50 | ON (strong) | 2.0 | ON (strong) | 2.00 | ON (strong) |

Vt Assumptions:
|Vtp(HV)|  1.2
|(Vtp(LV)|  0.7
Vtn(HV)  0.8
Vtn(LV)  0.7

301 of the inverting means 310 does not contribute to setting the input trip point. In yet a further embodiment, however, when the external power supply voltage vccio 306 is substantially greater than the threshold voltage of the PMOS transistor 301 of the inverting means 310, the PMOS transistor 301 of the inverter 310 is in the ON state for LOW input levels and substantially contributes to setting input trip point for the circuit 300.

In a further embodiment, a method of operating the circuit 300 as illustrated in FIG. 3 is disclosed. In a first step 380, the circuit 300 is provided with an input 304 (IN), wherein the input 304 comprises an input that has a variable range. In a second step 382, the input 304 is provided to the inverter circuit 310 and to a modulation circuit 320 such that the modulation circuit 320 sets the input trip point for the circuit 300. In a third step 384, the operation is regulating the response of the inverter circuit to the variable input 304 that is provided by the modulation circuit 320. In a fourth step, 386, when the vccio 306 is above a pre-defined threshold, in this case pull-down circuit 340 dynamically sets the trip point for the circuit 300. In fifth step 388, when the vccio 306 is below a pre-defined threshold, the pull-up circuit 330 dynamically sets the trip point for the circuit 300. A sixth step 390, comprises outputting an output 305 (OUT) wherein the NMOS 302 regulates the maximum output 305 (OUT) voltage of the circuit 300 to a value of the regulated power supply voltage 307 of the NMOS 302. A seventh step 392, comprises activating the pull-up circuit for setting the trip point of the circuit 300 when the external power supply voltage is LOW. Alternatively, if the external power supply voltage is HIGH, the seventh step is abandoned and an eighth step 394, comprises activating the pull-down circuit for setting the trip point of the circuit 300. Preferably, the modulation circuit 320 is arranged to dynamically set the trip point of the circuit 300.

Table 1 illustrates the conditions wherein the values of vccio, vpwr and vin are shown. The column on condition number is only illustrative of each ease that has been studied and in all lists 5 conditions for vin=Vil in the top section of the table and 5 conditions for vin=Vih in the bottom section of the table. The values of vin in the conditions illustrate the input voltage for the circuit 300 at that specification condition. The threshold voltage assumption for these conditions are |Vtp (HV)|=1.2V, |Vtp(LV)|=0.7V, Vtn(HV)=0.8V and Vtn(LV) =0.7V. For these conditions, operating states for key transistor devices or MOS devices are listed in the right hand side of Table 1.

Figure 4:
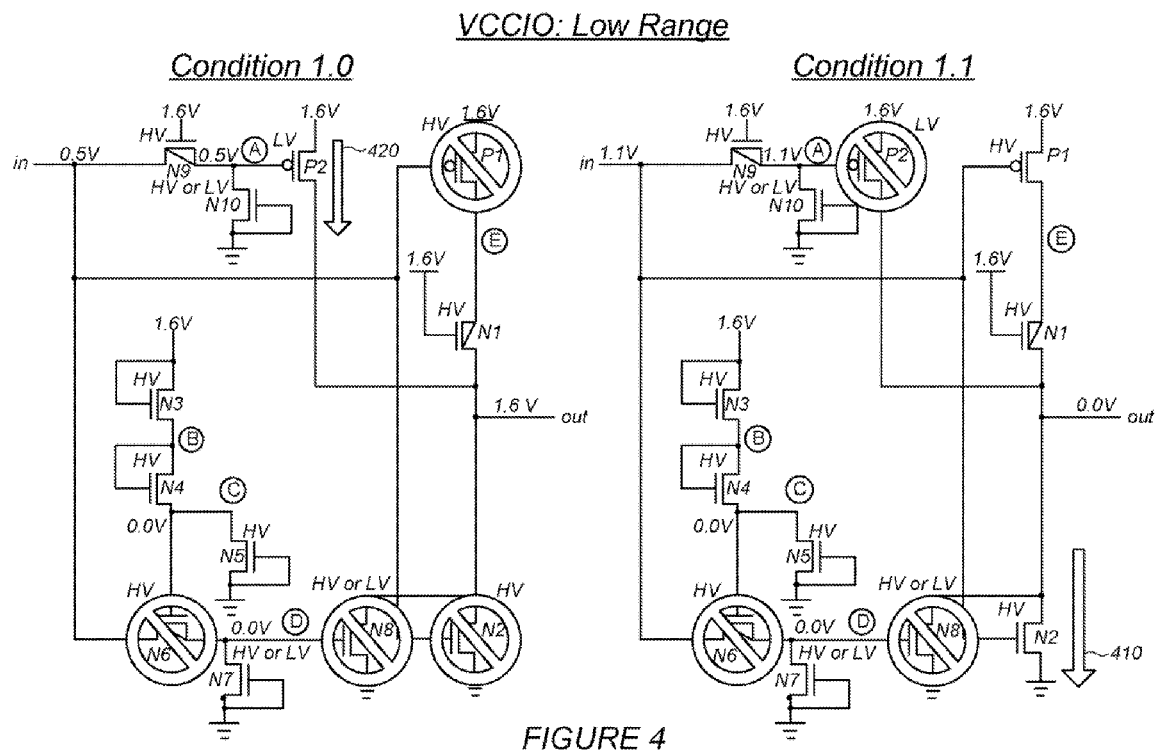
FIG. 4 illustrates an input buffer with adaptive trip point at two specific operating conditions when vccio is at a relatively low voltage.

FIG. 4 illustrates the operating state of the key MOS devices in the circuit 400, which is similar to FIG. 3, circuit 300 except that the voltage levels are indicated in the circuit, for LOW vccio at condition 1.0 of Table 1, when vin=Vil. The arrow 420 indicates the path of current flow in the circuit. The voltage levels at each node of the inverter circuit and the modulation circuit are indicated which correspond to the voltage levels in Table 1. For example considering the case of vin=Vil and at threshold voltage of |Vtp(HV)|=1.2V, |Vtp (LV)|=0.7V, Vtn(HV)=0.8V and Vtn(LV)=0.7V, when vccio=1.6V, vpwr=1.6V, vin=0.48V, and vout=1.6 V, the key MOS devices have the following operating states, |VGS| (ground-source) of first PMOS transistor 301=1.12V, and the PMOS transistor 301 is in an OFF state, |VGS| of the second PMOS transistor 302, in the pull-up circuit=1.12V and the second PMOS transistor is in an ON state, VGS of the NMOS transistor 343F in the pull-down circuit=0.0V indicative that the NMOS transistor 343F is in the OFF state and VGS of the NMOS 303=0.48V indicating that the NMOS transistor is in the OFF state.

FIG. 4 also illustrates the operating state of the key MOS devices in the circuit 400 for LOW vccio at condition 1.1 i.e., when vin=Vih. The arrow 410 indicates the path of current flow in the circuit. The voltage levels at each node of the inverter circuit and the modulation circuit are indicated which correspond to the voltage levels in Table 1. For example, considering the case of vin=Vih and at threshold voltage of |Vtp(HV)|=1.2V, |Vtp(LV)|=0.7V, Vtn(HV)=0.8V and Vtn (LV)=0.7V, when vccio=1.6V, vpwr=1.6V, vin=1.1V, and vout=0.0 V, the key MOS devices have the following operating states, |VGS| (gate-source) of first PMOS transistor 301=0.50V, and the PMOS transistor 301 is in an OFF state, |VGS| of the second PMOS transistor 302, in the pull-up circuit=0.50V and the second PMOS transistor is in an OFF state. VGS of the NMOS transistor 343F in the pull-down circuit=0.0V indicative that the NMOS transistor 343F is in the OFF state and VGS of the NMOS 303=1.1V indicating that the NMOS transistor is in the ON state. Circular symbols across the transistors shown in FIG. 4 indicate that the transistors are turned off for a specific condition and are therefore conducting negligible current.

Figure 5:
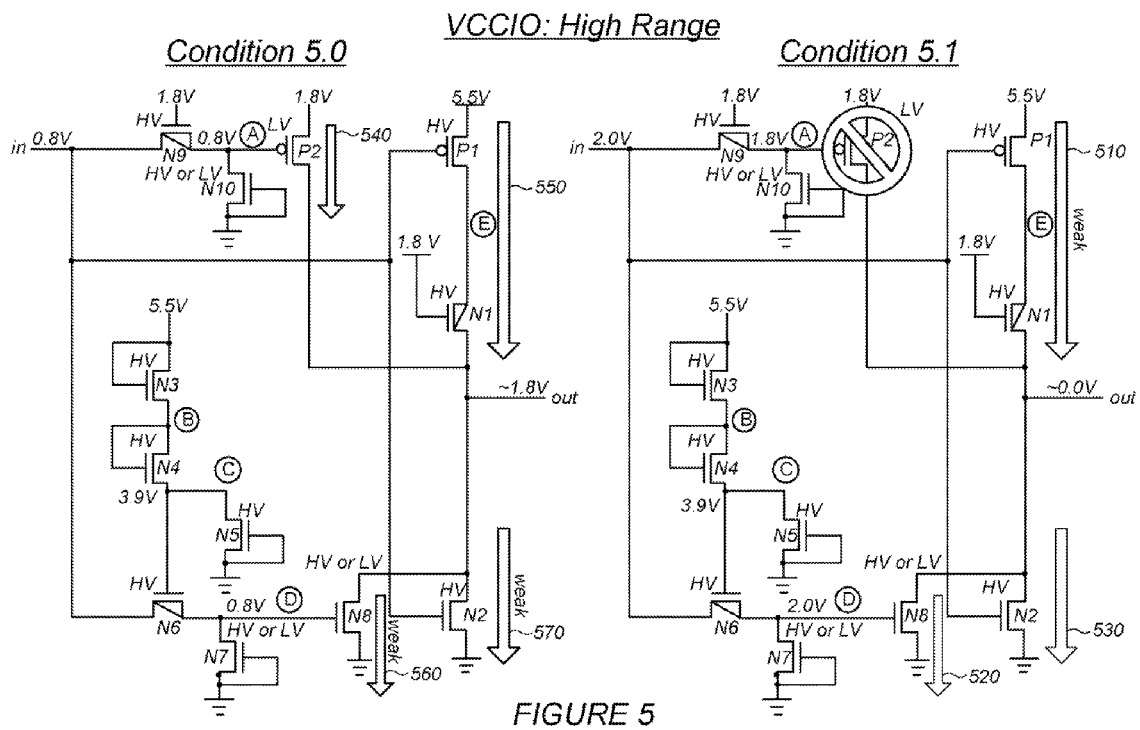
FIG. 5 illustrates an input buffer with adaptive trip point at two specific operating conditions when vccio is at a relatively high voltage.

FIG. 5 illustrates the operating state of the key MOS devices in the circuit 500, which is similar to FIG. 3, circuit 300 except that the voltage levels are indicated in the circuit, for HIGH vccio at condition 5.0 of Table 1, when vin=Vil. The arrows 540, 550, 560, and 570 show the current flow for this condition. Referring to Table 1, considering the ease of vin=Vil and at threshold voltage of |Vtp(HV)|=1.2, |Vtp (LV)|=0.7, Vtn(HV)=0.8 and Vtn(LV)=0.7, when vccio=5.5V, vpwr=1.8 and Vin=0.8V, the key MOS devices have the following operating states, |VGS| (ground-source) of first PMOS 301=4.7V, indicating that the PMOS 301 is in a strongly ON state, |VGS| of the second PMOS 302, in the pull-up circuit=1.0V and the second PMOS is in an ON state, VGS of the NMOS 343F in the pull-down circuit=0.8V indicative that the NMOS transistor 343F is in the weakly ON state and VGS of the NMOS transistor 303=0.8V indicating that the NMOS is in the OFF state. Circular symbols across the transistors shown in FIG. 5 indicate that the transistors are turned off for a specific condition and are therefore conducting negligible current.

Again, FIG. 5 illustrates the operation of key MOS devices PMOS 301, PMOS 331, NMOS 303, and NMOS 343F for condition 5.1 of Table 1. Arrows 510, 520, and 530 indicate the direction of current for the inverter and level shifter circuit. Considering the case of vin=Vih and at threshold voltage of |Vtp(HV)|=1.2, |Vtp(LV)|=0.7, Vtn(HV)=0.8 and Vtn (LV)=0.7, when vccio=5.5V, vpwr=1.8 and vin=2.0V, the key MOS devices have the following operating states, |VGS| (ground-source) of second PMOS 331=0.0V, indicating that the PMOS transistor 331 is in an OFF state, |VGS| of the first PMOS transistor 301=3.50V and the first PMOS transistor is in an strongly ON state, VGS of the NMOS transistor 343F in the pull-down circuit=2.0V indicative that the NMOS transistor 343F is in the strongly ON state and of the NMOS 303=2.0V indicating that the NMOS is in the strongly ON state.

Figure 6:
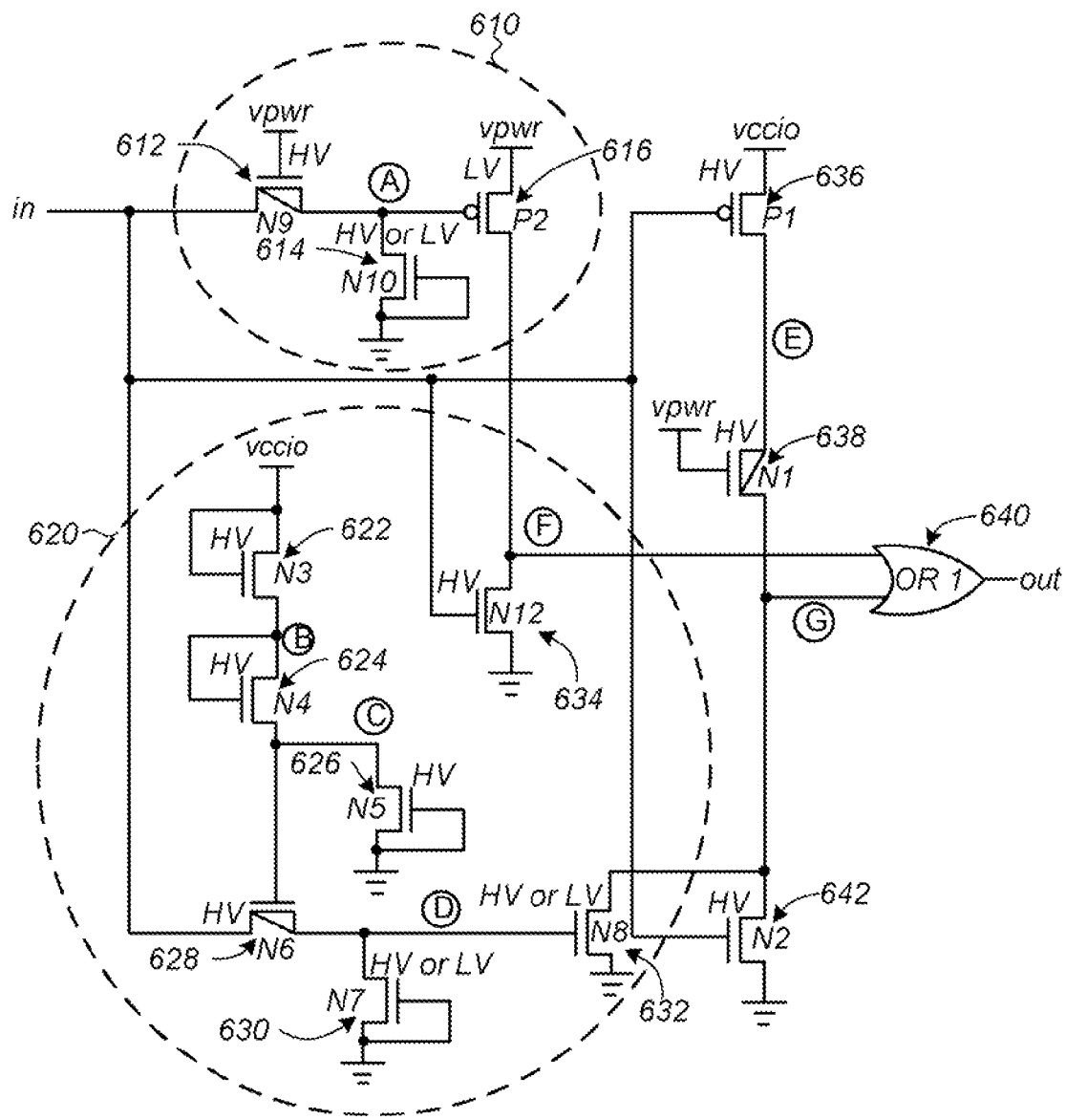
FIG. 6 illustrates an embodiment of the input buffer with adaptive trip points.

Referring to FIG. 6, an embodiment illustrates a circuit 600, which is an equivalent of the circuit shown in FIG. 3. The low voltage (LV) stage (output from the transistor 634) and the high voltage (HV) stage outputs (from the transistors 636, 638 and 642) are combined in a NOR gate 640 to generate a final buffer output (out). The transistors 638 (N1), 628 (N6) and 612 (N9) have threshold voltage (Vt)~0V. Voltage vpwr is internal low voltage (LV) power supply. Voltage vccio is external high voltage (HV) power supply. Transistors 614 (N10), 626 (N5), and 630 (N7) provide leakage current to keep nodes A, C, and D from drifting to a high voltage level.

It should be apparent to a skilled person that various other combinations that are not shown can be constructed from Table 1. In the Table reference to Weak and Strong against the state of the MOS device such as ON (Weak) or ON (Strong) indicates that the MOS device is in a weakly ON state or in a strongly ON state.

Advantages of the invented circuit and method are as follows. The input trip point dynamically adapts to the vccio voltage level (supply voltage range). This enables meeting various input Vih/Vil DC specifications at different supply voltage ranges. Control inputs are not required to modulate the input trip point. The invented architecture allows use of low voltage (LV) transistors in the input stage to improve (decrease) the minimum operating supply voltage. Minimal circuitry is required for input trip modulation.

In an embodiment of the invention, a number of diode-connected n-channel transistors can be regulated to modulate voltage on nodes C and D to control the action of the transistor 343F, as shown in the circuit 300. In an alternate embodiment of the invention, either parallel pull up or pull down may be omitted depending on the desired input trip point variability.

In an embodiment, a series switch may be added to either or both of the parallel pull up and pull down paths. This switch can be configured with a control input to change the adaptive input trip point behavior for different input buffer selection options. An example application is a buffer implemented in a chip that has selectable input standards.

In an embodiment, multiple parallel pull down paths may be added with different numbers of diode-connected n-channels to the gate of the transistor 343F, as shown in circuit 300. Each of these paths can be designed to turn ON at different values of supply voltage to give different trip point adaptability across different power supply voltage ranges.

In an embodiment, circuit elements as pin junction diodes can be substituted for the diode-connected n-channel diodes between vccio and node C.

In an alternate embodiment, the transistor 343D can be replaced by an enhancement mode n-channel transistor, which is similar to or identical to the transistors 343A and 343B in the series connected diode stack to vccio. In this case, the number of diode connected transistors in the stack to vccio would typically be reduced to give the same voltage on node D.

For purposes of clarity, many of the details of the circuit comprising input buffer with adaptive trip points and the methods of designing, operating and manufacturing the same that are widely known and are not relevant to the present invention have been omitted from the following description. It is understood that while the embodiments set forth herein have been described in detail, it should be understood that the present invention could be subject to various changes, substitutions, and alterations without departing from the spirit and scope of the invention. For purposes of clarity, many of the details of the improved circuit and the methods of designing, operation and manufacturing the same that are widely known and are not relevant to the present invention have been omitted from the following description.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

What is claimed is:

1. A circuit comprising:
   an inverting means for a variable input means;
   a modulation means for regulating a response of the inverting means for the variable input means, wherein the modulation means comprises a pull-up means and a pull-down means, wherein the pull-up means and the pull-down means are arranged to dynamically set a trip-point of a circuit depending on an external supply voltage, wherein the pull-up means comprises a second PMOS transistor, a third NMOS transistor and a fourth NMOS transistor, wherein the second PMOS transistor is coupled between a first NMOS transistor and a second NMOS transistor of the inverting means and is activated to determine a trip-point for the inverting means at a low external power supply voltage.

2. The circuit of claim 1, wherein the second PMOS transistor and the third NMOS transistor are provided with a regulated power supply voltage to maintain a constant supply voltage.

3. The circuit of claim 1, wherein the fourth NMOS transistor is provided with a ground potential.

4. A circuit comprising:
   an inverting means for a variable input means;
   a modulation means for regulating a response of the inverting means for the variable input means, wherein the modulation means comprises a pull-up means and a pull-down means, wherein the pull-up means and the pull-down means are arranged to dynamically set a trip-point of the circuit depending on an external supply voltage;
   wherein the pull-down means comprises a fifth NMOS transistor, a sixth NMOS transistor, a seventh NMOS transistor, an eighth NMOS transistor, a ninth NMOS transistor and a tenth NMOS transistor.

5. The circuit of claim 4 wherein the fifth NMOS transistor is coupled to the sixth NMOS transistor and the fifth NMOS transistor is provided with an external power supply voltage.

6. The circuit of claim 4, wherein the sixth NMOS transistor is coupled to the seventh NMOS transistor and to the eighth NMOS transistor, wherein the seventh NMOS transistor is provided with a ground potential.

7. The circuit of claim 6, wherein the eighth NMOS transistor is coupled to the ninth NMOS transistor, the ninth NMOS transistor provided with the ground potential.

8. The circuit of claim 7, wherein the ninth NMOS transistor is coupled to the tenth NMOS transistor, the tenth NMOS transistor is provided with the ground potential.

9. The circuit of claim 8, wherein the tenth NMOS transistor is coupled between a first NMOS transistor and a second NMOS transistor of the inverting means and is activated to determine a trip-point for the inverting means at a high external power supply voltage.

10. A method of operating a circuit, comprising:
    regulating a response of the circuit for a variable input range in a modulation circuit by means of a pull-down circuit and a pull-up circuit, wherein the pull-up circuit comprises a second PMOS transistor, a third NMOS transistor, and a fourth NMOS transistor, wherein the second PMOS transistor is coupled between a first NMOS transistor and a second NMOS transistor of an inverting circuit;
    outputting a regulated output signal;
    activating the second PMOS transistor for setting a trip-point of an inverter circuit at a LOW external power supply voltage; and
    activating the pull-down circuit for setting the trip-point of the inverter circuit at a HIGH external power supply voltage.

11. The method of claim 10, comprising limiting a maximum output signal to a regulated power supply voltage of a first NMOS.

* * * * *